US009774338B2

(12) United States Patent
Lee et al.

(10) Patent No.: US 9,774,338 B2
(45) Date of Patent: Sep. 26, 2017

(54) DIGITAL-ANALOG CONVERSION METHOD AND DEVICE

(71) Applicant: Samsung Electronics Co., Ltd., Suwon-si, Gyeonggi-do (KR)

(72) Inventors: Jongwoo Lee, Seoul (KR); Thomas Byunghak Cho, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/315,549

(22) PCT Filed: Jun. 2, 2015

(86) PCT No.: PCT/KR2015/005514
§ 371 (c)(1),
(2) Date: Dec. 1, 2016

(87) PCT Pub. No.: WO2015/186950
PCT Pub. Date: Dec. 10, 2015

(65) Prior Publication Data
US 2017/0201263 A1   Jul. 13, 2017

(30) Foreign Application Priority Data

Jun. 2, 2014   (KR) .................... 10-2014-0067206

(51) Int. Cl.
*H03M 1/06*   (2006.01)
*H03M 1/66*   (2006.01)

(52) U.S. Cl.
CPC .......... *H03M 1/0604* (2013.01); *H03M 1/66* (2013.01)

(58) Field of Classification Search
CPC ............................. H03M 1/66; H03M 1/0604
USPC ................. 341/118, 135, 136, 144
See application file for complete search history.

(56) References Cited

U.S. PATENT DOCUMENTS

| 8,330,633 B2* | 12/2012 | Brubaker | H03M 1/0614 341/133 |
| 9,531,337 B2* | 12/2016 | Chen | H03F 3/45479 |
| 2006/0119422 A1 | 6/2006 | Sakurai et al. | |
| 2007/0222651 A1 | 9/2007 | Hofer | |
| 2011/0037630 A1 | 2/2011 | McLachlan et al. | |
| 2013/0201041 A1 | 8/2013 | Roze et al. | |
| 2013/0214944 A1 | 8/2013 | Kosic | |

FOREIGN PATENT DOCUMENTS

KR   10-2013-0039461 A   4/2013

* cited by examiner

*Primary Examiner* — Khai M Nguyen
(74) *Attorney, Agent, or Firm* — Jefferson IP Law, LLP

(57) ABSTRACT

The present invention relates to a digital-analog conversion method and device for adjusting a reference current to be used in a digital-analog conversion, by using a common mode feedback device, and the digital-analog conversion method of the present invention comprises the steps of: generating a reference current by receiving a reference voltage; converting a digital signal into an analog signal by receiving the generated reference current; detecting a common mode voltage, which is the average value of a both-end voltage of the converted analog signal; comparing the detected common mode voltage with the reference voltage; generating a feedback signal on the basis of the comparison result; and adjusting the reference current according to the generated feedback signal.

10 Claims, 7 Drawing Sheets

DIGITAL-ANALOG CONVERSION METHOD AND DEVICE

TECHNICAL FIELD

The present invention relates to a digital-analog conversion method and device, and more particularly, to a digital-analog conversion method and device of a common mode feedback method.

BACKGROUND ART

A transmitting terminal of a recently using wireless communication device includes a Digital-Analog Converter (DAC) that converts a digital signal generated in a baseband modem to an analog signal. The DAC has an in-phase digital-analog conversion unit and a quadrature-phase digital-analog conversion unit in pairs. Each analog current signal converted in each conversion unit is converted to a voltage signal using a current-voltage converter within a Radio Frequency Integrated Circuit (RFIC) or an external resistor.

A digital signal generated in the baseband modem is constant in an In-Phase/Quadrature Phase (I/Q) gain. However, in a converted analog signal, an I/Q gain becomes different from a target value due to several factors such as a process deviation and a temperature change. In this case, because each of an In-Phase gain and a Quadrature Phase gain is different from a target value, a gain difference occurs between an In-Phase and a Quadrature Phase (I/Q mismatch).

A problem of the I/Q mismatch operates as a large factor that deteriorates an output Error Vector Magnitude (EVM) of a transmitter to worsen a communication quality, but conventionally, a signal was output with an open-loop method. In the conventional art, a design has been performed to reduce a process deviation that has an influence on an I/Q gain and this becomes a cause that increases a magnitude of consumption power or a size of a device.

DISCLOSURE OF INVENTION

Technical Problem

The present invention has been made in an effort to provide a feedback system that senses a common mode voltage of a DAC output voltage and that compares a reference voltage that does not change in a temperature and process change and the sensed common mode voltage to control an output current. The feedback system can provide a stable DAC output voltage in a temperature and process change and compensate mismatch between I/Q.

Solution to Problem

In accordance with an aspect of the present invention, a digital-analog conversion method includes: receiving a reference voltage to generate a reference current; converting a digital signal to an analog signal according to the generated reference current; detecting a common mode voltage, which is an average value of a both end voltage of the converted analog signal; comparing the detected common mode voltage and the reference voltage; generating a feedback signal based on the comparison result; and adjusting the reference current according to the generated feedback signal.

In accordance with another aspect of the present invention, a digital-analog conversion device includes: a current supply unit that generates a reference current based on a reference voltage and that adjusts an amount of the reference current according to a feedback signal; a digital-analog conversion unit that converts a digital signal to an analog signal according to the generated reference current; a common mode feedback unit that detects a common mode voltage, which is an average value of a both end voltage of the converted analog signal; and a feedback signal generator that compares the detected common mode voltage and the reference voltage and that generates the feedback signal based on the comparison result.

Advantageous Effects of Invention

According to a digital-analog conversion method and device of the present invention, when the difference exists between an analog output voltage and a reference voltage, by generating a feedback signal for adjusting a reference current used for digital-analog conversion, a voltage of an analog signal output can be constantly maintained.

MODE FOR THE INVENTION

Figure 1:
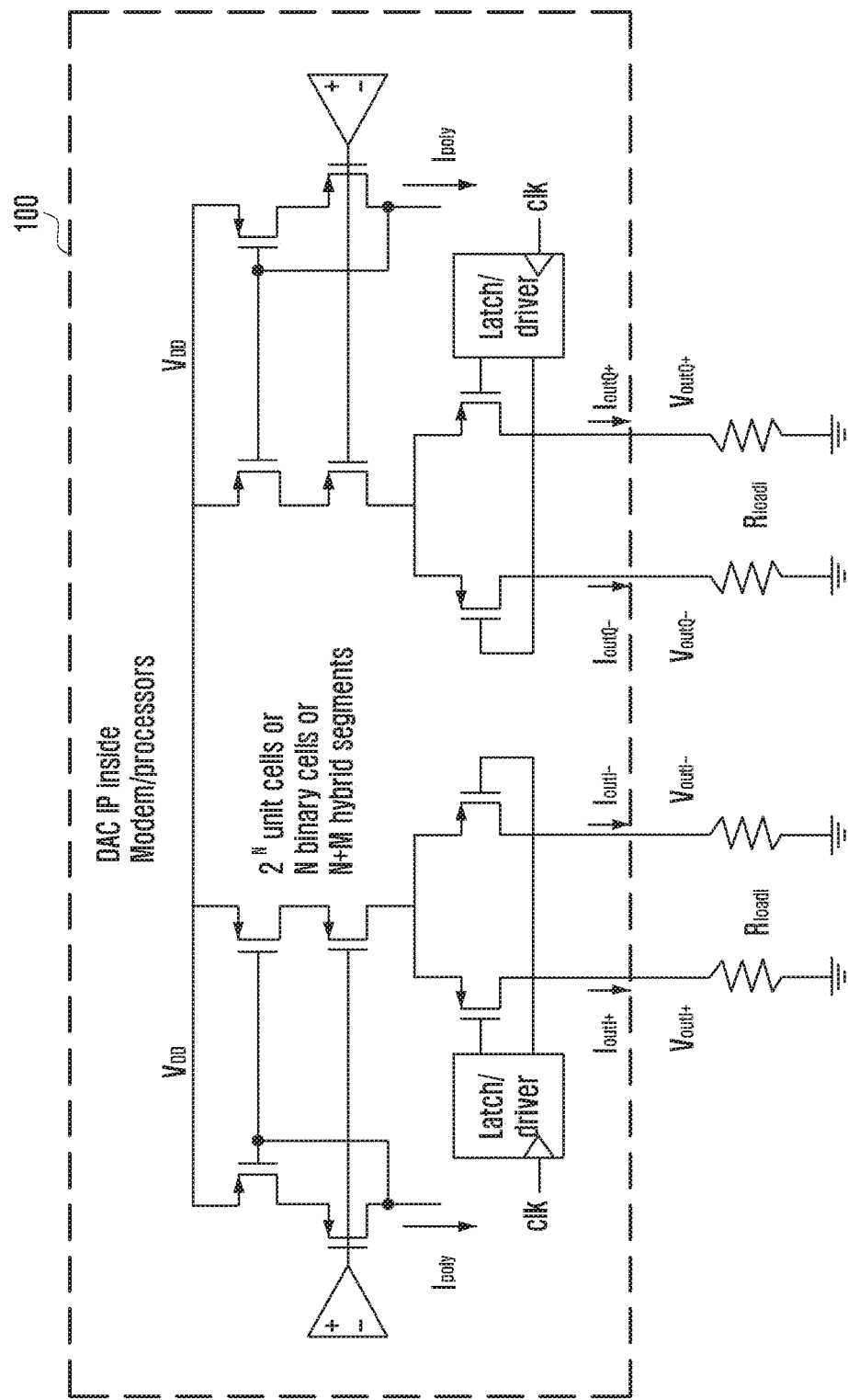
FIG. 1 is a diagram illustrating a circuit structure of a digital-analog conversion device.

Hereinafter, an exemplary embodiment according to the present invention will be described in detail with reference to the attached drawings. The same reference numbers are used throughout the drawings to refer to the same or like parts. Further, detailed descriptions of well-known functions and structures incorporated herein may be omitted to avoid obscuring the subject matter of the present invention.

Exemplary embodiments of the present invention disclosed in this specification and drawings are suggested as a specific example to easily describe the present invention and to help understanding thereof and do not limit the scope of the present invention. Therefore, it will become apparent to a person of ordinary skill in the art that changes and variations obtained based on the spirit and scope of the present invention in addition to exemplary embodiments disclosed herein are included in the scope of the present invention.

In this specification, when describing an exemplary embodiment, a description on technology contents widely known in the art and that are not directly related to the present invention may be omitted to avoid obscuring the subject matter of the present invention.

Similarly, in the attached drawings, some constituent elements are exaggeratingly omitted or are schematically shown. Further, a size of each constituent element does not entirely reflect an actual size. Like reference numerals designate like elements throughout the drawings.

These advantages and features of the present invention and a method of accomplishing them will become more readily apparent from the detailed description given hereinafter together with the accompanying drawings. However, the present invention is not limited to the following exemplary embodiments but may be implemented in different forms, and the present exemplary embodiments enable to completely disclose the present invention and are provided to completely know the scope of the invention to those skilled in the art, and the present invention is defined by the scope of claims. Like reference numerals designate like elements throughout the specification.

FIG. 1 is a diagram illustrating a circuit structure of a digital-analog conversion device.

With reference to FIG. 1, a quadrature modulation method of digital-analog converter 100 includes an In-Phase Digital-to-Analog Converter (I-DAC) and a Quadrature Phase Digital-to-Analog Converter (Q-DAC). The quadrature modulation method is a modulation method of transmitting data by converting and adjusting an amplitude and a phase of an In-Phase carrier wave and a quadrature carrier wave, which are two independent carrier waves. FIG. 1 illustrates that in each of the I-DAC and the Q-DAC, the number of an unit cell is one, but it is not limited thereto and the number of a unit cell may be, for example $2^N$.

In operation of an I-DAC portion, a reference current generation circuit receives a reference voltage $V_{ref}$ and a bias voltage generated in a bandgap reference circuit to generate a reference current $I_{poly}$. The bandgap reference circuit supplies a constant magnitude of reference voltage (generally 1.26V) independently of a temperature and other environments. The reference voltage may be referred to as a bandgap voltage.

The reference current $I_{poly}$ is supplied to a digital-analog conversion circuit, and the digital-analog conversion circuit, having received the reference current $I_{poly}$, converts a digital signal received from the outside to an analog signal. Analog current outputs $I_{outI+}$ and $I_{outI-}$ of the I-DAC are again converted to an analog voltage output using a load resistor $R_{loadI}$. The same process is performed in even the Q-DAC.

The reference current $I_{poly}$ is generated by dividing the reference voltage $V_{ref}$ by internal resistance $R_{poly}$ of the digital-analog conversion device, and the analog output current is generated by the reference current $I_{poly}$ and a digital code $D_{code}$. Because the analog current output is converted to a voltage by the load resistor $R_{load}$, an output voltage value is finally proportional to the reference current $I_{poly}$, each digital code $D_{code}$, and the load resistor $R_{load}$. Therefore, the analog output voltage may be represented by Equation 1.

$$V_{out} = I_{out}sR_{load} = I_{poly}sD_{code}sR_{load} = \frac{V_{ref}}{R_{poly}}sD_{code}sR_{load} \quad \text{Equation 1}$$

The internal resistance $R_{poly}$ and the load resistor $R_{load}$ have a value changing according to a temperature, and the internal resistance $R_{poly}$ is located within the digital-analog conversion device, and when the load resistor $R_{load}$ is located at the outside of the digital-analog conversion device, the difference may occur in a peripheral temperature. Even if the entire of both resistors is located within the digital-analog conversion device, when the resistors are separated far, a temperature coefficient having changing resistance may be different. In this case, a proportional relationship between the internal resistance $R_{poly}$ and the load resistor $R_{load}$ is not established and thus an analog output voltage deviates from a target voltage value. The phenomenon occurs even in the Q-DAC and thus the difference finally occurs between an output voltage of the I-DAC and an output voltage of the Q-DAC.

Further, by a deviation between transistors constituting an output current in the I/Q DAC, a gain of an I/Q output current may be changed, and by a process/temperature deviation between I/Q Load resistance, the difference occurs between a load resistor $R_{loadI}$ value of the I-DAC and a load resistor $R_{loadQ}$ value of the Q-DAC and thus a phenomenon may occur that a voltage output gain between I/Q DAC changes. Such I/Q mismatch deteriorates an output EVM characteristic of a transmitter to operate as a factor that deteriorates a communication quality.

In order to solve the problem, a compensation circuit or a feedback circuit according to an exemplary embodiment of the present invention detects a common mode of an output voltage of an I/Q channel and compares the common mode with a reference voltage. In this specification, a common mode may be used as the same meaning as a common mode voltage. A voltage of an analog signal output of each of I/Q is compensated to be equal to a reference voltage according to the comparison result. Accordingly, in each of I/Q, as a common mode of the analog output voltage becomes equal to a reference voltage $V_{ref}$, the output voltage may correspond with a target value, and the same gain may be formed between I/Q.

Figure 2:
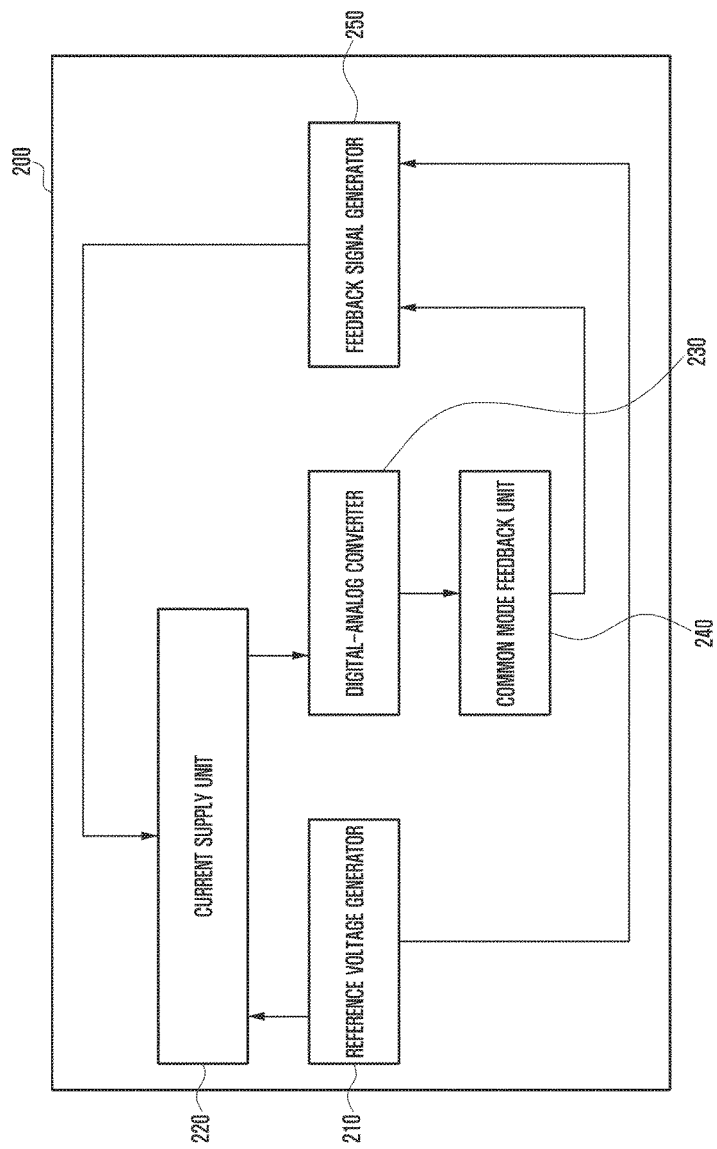
FIG. 2 is a block diagram illustrating an internal structure of a digital-analog conversion device according to an exemplary embodiment of the present invention.

FIG. 2 is a block diagram illustrating an internal structure of a digital-analog conversion device 200 according to an exemplary embodiment of the present invention.

With reference to FIG. 2, the digital-analog conversion device 200 according to the present exemplary embodiment may include a reference voltage generator 210, current supply unit 220, digital-analog conversion unit 230, common mode feedback unit 240, and feedback signal generator 250.

The reference voltage generator 210 has no influence on an environmental factor such as a temperature, supply voltage, and process and outputs a constant magnitude of voltage. The constant magnitude of voltage, i.e., a reference voltage $V_{ref}$ output by the reference voltage generator 210 may be transferred to the current supply unit 220 and the feedback signal generator 250.

The current supply unit 220 generates a reference current $I_{poly}$ using the reference voltage $V_{ref}$ and a bias voltage and transfers the generated reference current $I_{poly}$ to the digital-analog conversion unit 230. The reference current $I_{poly}$ may be generated by dividing the reference voltage $V_{ref}$ by the internal resistance $R_{poly}$ of the current supply unit 220.

The current supply unit 220 may correct the reference current $I_{poly}$ according to a feedback signal from the feedback signal generator 250. A method of correcting the reference current $I_{poly}$ may include for example, a method of adjusting with a digital method by adding an Aux Current Cell for distributing a current using a switch or a method of adjusting a bias voltage input to the current supply unit 220 with an analog method by changing a characteristic value of a circuit element.

The digital-analog conversion unit 230 receives the reference current $I_{poly}$ from the current supply unit 220 and converts a digital signal received from the outside (e.g., a baseband modem) to an analog signal. The converted analog signal is output to plus (+) and minus (−) currents. The each analog output current is converted to an analog output voltage by the load resistor $R_{load}$.

The common mode feedback unit 240 is connected to both ends of the digital-analog conversion unit 230 to detect a common mode voltage, which is an average value of an analog output voltage. The common mode feedback unit 240 transfers the detected common mode voltage to the feedback signal generator 250.

In order to detect the common mode voltage, the common mode feedback unit 240 may use at least one of a resistance distributor, switched capacitor, and transistor pair and this will be described later.

The feedback signal generator 250 compares a common mode voltage received from the common mode feedback unit 240 and a reference voltage $V_{ref}$ received from the reference voltage generator 210. The feedback signal generator 250 generates a feedback signal based on the comparison result. The feedback signal controls the current supply unit 220 to adjust an amount of the reference current $I_{poly}$. As described above, when it is assumed that an analog output voltage is proportional to the reference current $I_{poly}$, a digital code $D_{code}$, and the load resistor $R_{load}$, by adjusting the reference current $I_{poly}$, a magnitude of an analog output voltage can be adjusted.

Figure 3:
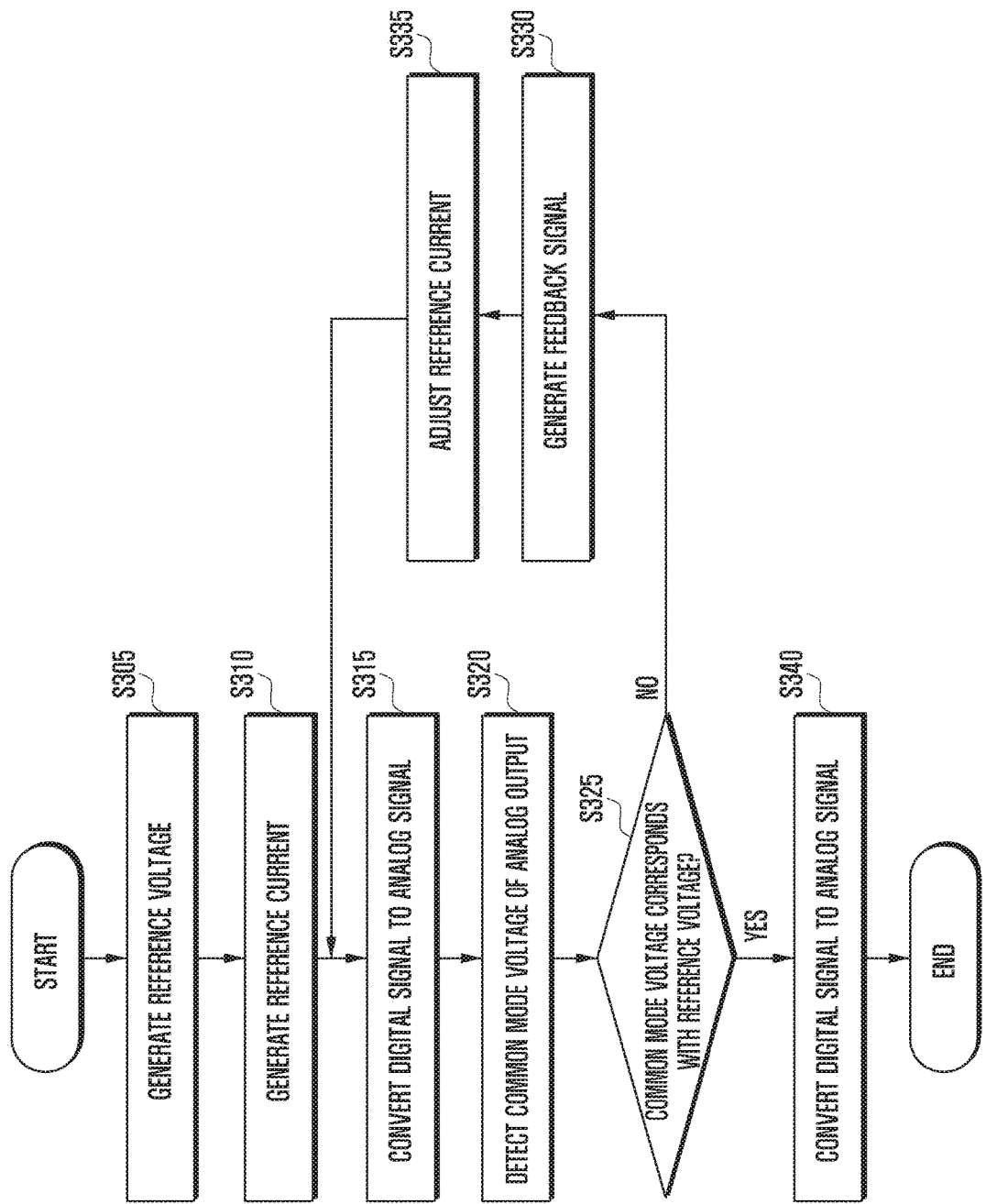
FIG. 3 is a flowchart illustrating a digital-analog conversion process according to an exemplary embodiment of the present invention.

FIG. 3 is a flowchart illustrating a digital-analog conversion process according to an exemplary embodiment of the present invention.

With reference to FIG. 3, the reference voltage generator 210 generates a constant magnitude of reference voltage $V_{ref}$ regardless of an environment factor such as a temperature change at step S305.

The current supply unit 220 divides the reference voltage $V_{ref}$ received from the reference voltage generator 210 by the internal resistance $R_{poly}$ to generate a reference current $I_{poly}$ at step S310.

The digital-analog conversion unit 230 receives the reference current $I_{poly}$ to convert a digital signal input from the outside to an analog signal at step S315. The converted analog signal is output to both end currents of plus (+) and minus (−), and the analog output current is converted to an analog output voltage using the external resistor $R_{load}$.

The common mode feedback unit 240 detects a common mode voltage, which is an average value of the analog output both end voltage at step S320. The common mode feedback unit 240 may transfer the detected common mode voltage to the feedback signal generator 250.

The feedback signal generator 250 compares the common mode voltage and a reference voltage $V_{ref}$ generated in the reference voltage generator 210 at step S325. If the common mode voltage does not correspond with the reference voltage, the feedback signal generator 250 generates a feedback signal for controlling a reference current $I_{poly}$ output from the current supply unit 220 at step S330. If a common mode of the analog output voltage is greater than a reference voltage $V_{ref}$, the feedback signal is used for reducing an analog output current by reducing the reference current $I_{poly}$. If a common mode of the analog output voltage is smaller than a reference voltage $V_{ref}$, the feedback signal is used for increasing an analog output current by increasing the reference current $I_{poly}$.

The current supply unit 220 adjusts the reference current $I_{poly}$ according to the feedback signal at step S335 and performs a digital-analog conversion process at step S315.

If the common mode voltage corresponds with the reference voltage $V_{ref}$ at step S325, a feedback signal is not generated but a digital-analog conversion process is performed at step S340.

At step S325 of FIG. 3, it is determined whether a reference voltage is equal to a common mode voltage, but if a voltage difference between a reference voltage and a common mode voltage is equal to or less than a specific value (e.g. 0.1V), a feedback signal may not be generated, and if a voltage difference between a reference voltage and a common mode voltage is greater than a specific value (e.g. 0.1V), a feedback signal may be generated.

Figure 4:
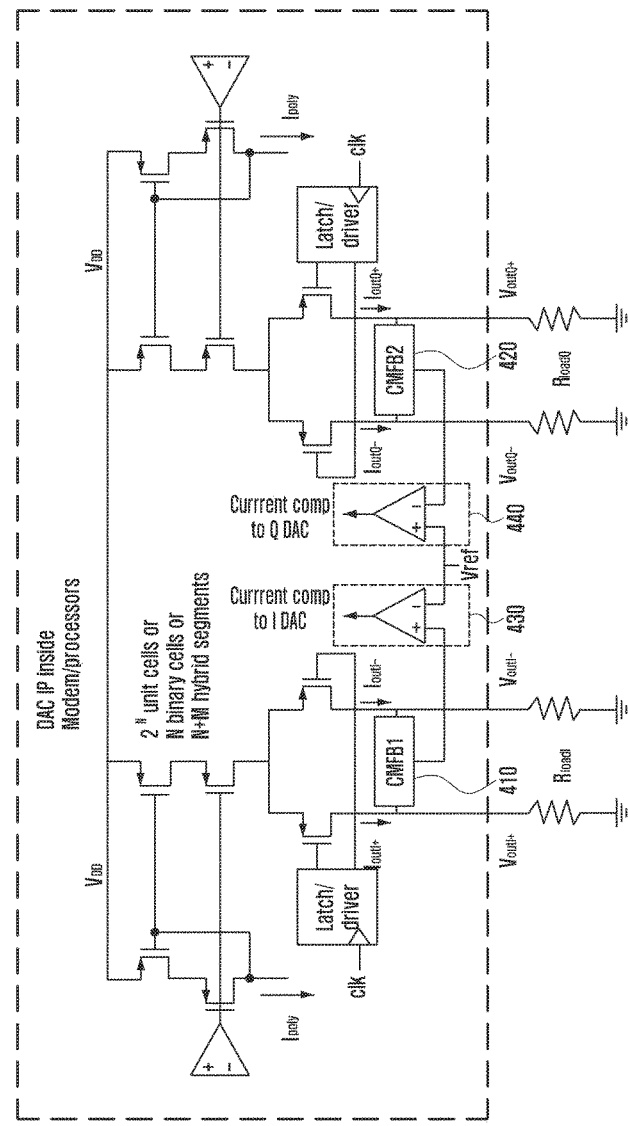
FIG. 4 is a diagram illustrating a circuit structure of a digital-analog conversion device according to an exemplary embodiment of the present invention.

FIG. 4 is a diagram illustrating a circuit structure of a digital-analog conversion device according to an exemplary embodiment of the present invention.

With reference to FIG. 4, it may be determined that Common Mode Feedback (CMFB) circuits 410 and 420 and comparison circuits 430 and 440 that compare a common mode voltage and a reference voltage $V_{ref}$ are added to the digital-analog conversion device of FIG. 1.

The CMFB circuits 410 and 420 perform a function of detecting a converted analog signal output voltage. An illustrated structure of the CMFB circuits 410 and 420 will be described later with reference to FIGS. 5, 6, and 7. The comparison circuits 430 and 440 compare a common mode of an analog signal output voltage detected in the CMFB circuits 410 and 420 and a reference voltage $V_{ref}$ and generate a feedback signal for adjusting an reference current $I_{poly}$ used for digital-analog conversion according to the comparison result.

For example, if a common mode of an analog signal output voltage is greater than a reference voltage ($V_{CM} > V_{ref}$), by reducing a reference current $I_{poly}$, an output current is reduced and thus a common mode output voltage is lowered and until the common mode output voltage becomes equal to the reference voltage, a reference current is continuously lowered. In contrast, if a common mode of an analog signal output voltage is smaller than a reference voltage ($V_{CM} < V_{ref}$), by increasing the reference current $I_{poly}$, an output current increases and thus a common mode output voltage increases and until the common mode output voltage becomes equal to a reference voltage, the reference current continuously increases. FIG. 4 illustrates that the comparison circuits 430 and 440 are amplifiers, but are not limited thereto.

The CMFB circuits 410 and 420 and the comparison circuits 430 and 440 are added to I-DAC and Q-DAC, respectively, of a quadrature modulation method of digital-analog converter. By performing a feedback process in each of the I-DAC and the Q-DAC, an analog current output of the I-DAC and the Q-DAC is adjusted to be equal to a target value. As the adjustment result, by corresponding a gain of a current output of the I-DAC and a gain of a current output of the Q-DAC, the above-described I/Q gain mismatch problem can be solved.

Figure 5:
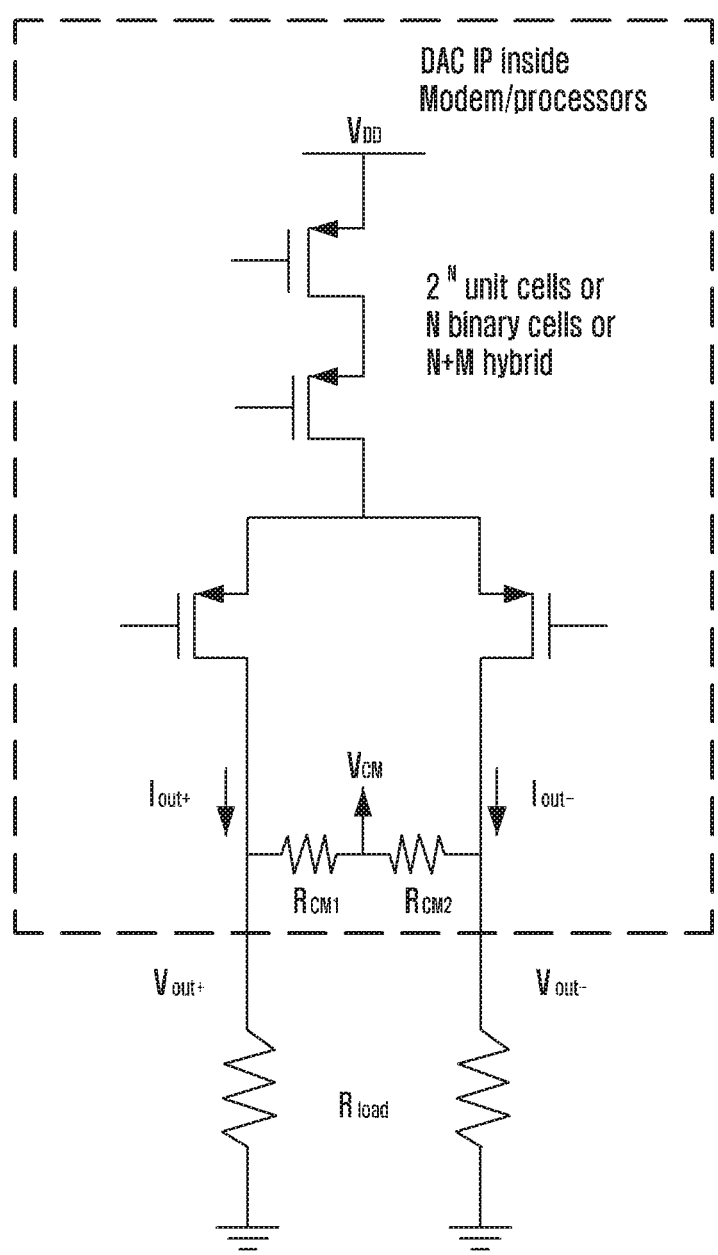
FIG. 5 is a diagram illustrating a structure of a common mode feedback circuit of a digital-analog conversion device according to an exemplary embodiment of the present invention.

FIG. 5 is a diagram illustrating a structure of a CMFB circuit of a digital-analog conversion device according to an exemplary embodiment of the present invention.

With reference to FIG. 5, it may be determined that a resistance distributor is attached to both ends of an analog output current of a digital-analog conversion unit. In FIG. 5, when values of $R_{CM1}$ and $R_{CM2}$ are the same, a common mode voltage $V_{CM}$ becomes an average value of both end voltages $V_{OUT+}$ and $V_{OUT-}$ of an analog signal.

Figure 6:
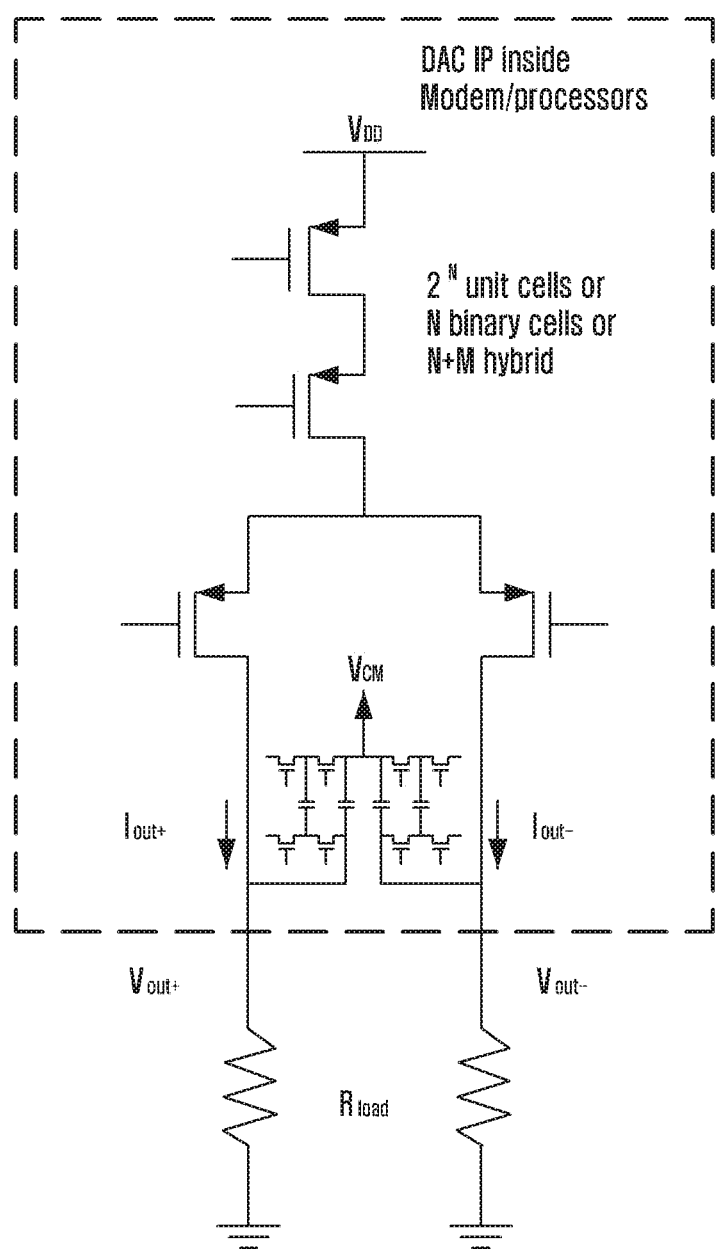
FIG. 6 is a diagram illustrating a structure of a common mode feedback circuit of a digital-analog conversion device according to another exemplary embodiment of the present invention.

FIG. 6 is a diagram illustrating a structure of a CMFB circuit of a digital-analog conversion device according to another exemplary embodiment of the present invention.

With reference to FIG. 6, by attaching a switched capacitor circuit to both ends of an analog output current of a digital-analog conversion unit, a common mode voltage $V_{CM}$ may be fed back.

Figure 7:
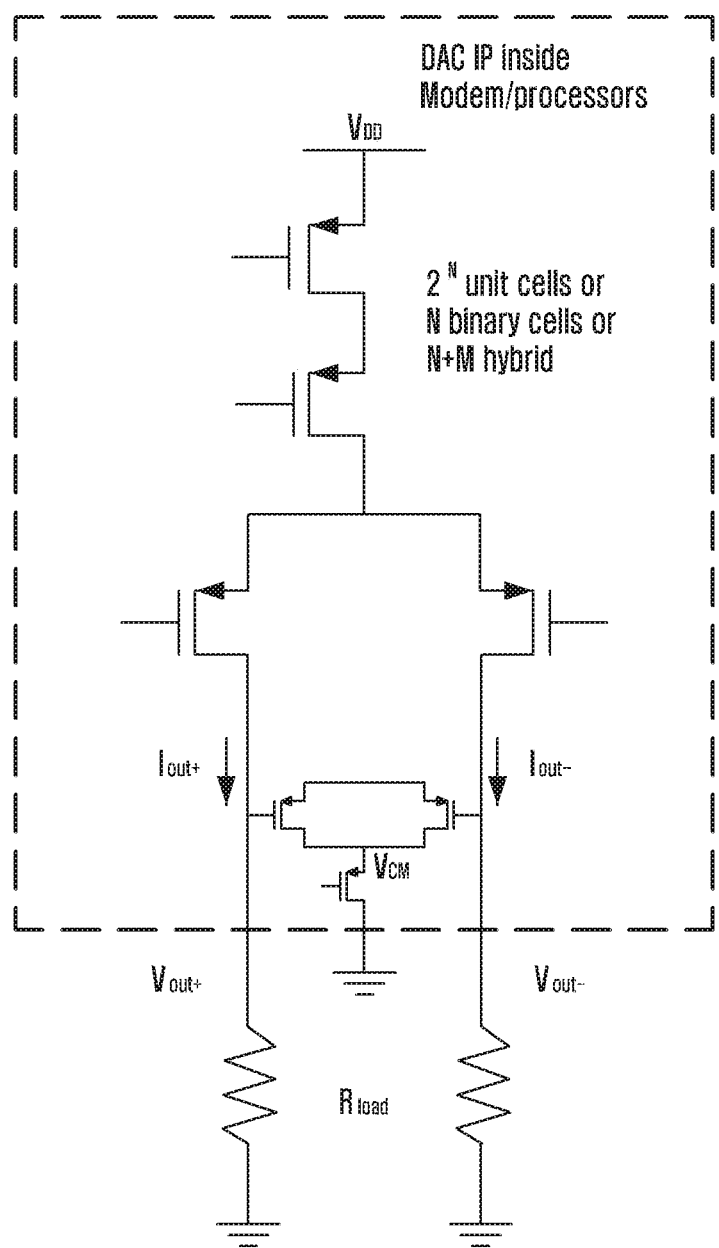
FIG. 7 is a diagram illustrating a structure of a common mode feedback circuit of a digital-analog conversion device according to another exemplary embodiment of the present invention.

FIG. 7 is a diagram illustrating a structure of a CMFB circuit of a digital-analog conversion device according to another exemplary embodiment of the present invention.

With reference to FIG. 7, by attaching transistor pairs, which are an active component to both ends of an analog output current of a digital-analog conversion unit, a common mode voltage $V_{CM}$ may be fed back.

In FIGS. 5 to 7, three methods of detecting a common mode of an analog output voltage are suggested, but a method of detecting a common mode of an analog output voltage is not limited thereto and a common mode of an analog output voltage may be detected with a method that is not shown in FIGS. 5 to 7.

According to an exemplary embodiment of the present invention, by adjusting a reference current $I_{poly}$ used for digital-analog conversion, an analog output voltage may be constantly maintained. Therefore, a digital-analog conversion method and device may be provided that can equally maintain gains of an in-phase and a quadrature phase.

Exemplary embodiments of the present invention disclosed in this specification and drawings are suggested as a specific example to easily describe the present invention and to help understanding thereof and do not limit the scope of the present invention. Therefore, it will become apparent to a person of ordinary skill in the art that changes and variations obtained based on the spirit and scope of the present invention in addition to exemplary embodiments disclosed herein are included in the scope of the present invention.

What is claimed is:

1. A digital-analog conversion method, comprising:
    receiving a reference voltage to generate a reference current;
    converting a digital signal to an analog signal according to the generated reference current;
    detecting a common mode voltage, which is an average value of a both end voltage of the converted analog signal;
    comparing the detected common mode voltage and the reference voltage;
    generating a feedback signal based on the comparison result; and
    adjusting the reference current according to the generated feedback signal.

2. The digital-analog conversion method of claim 1, wherein generating a feedback signal based on the comparison result comprises:

generating, if the detected common mode voltage is greater than the reference voltage, the feedback signal for reducing the reference current; and
generating, if the detected common mode voltage is smaller than the reference voltage, the feedback signal for increasing the reference current.

3. The digital-analog conversion method of claim 1, wherein adjusting the reference current according to the generated feedback signal comprises increasing or reducing the generated reference current with a digital method using an Aux Current Cell.

4. The digital-analog conversion method of claim 1, wherein adjusting the reference current according to the generated feedback signal comprises adjusting a bias voltage used for generating the reference current with an analog method.

5. The digital-analog conversion method of claim 1, wherein detecting a common mode voltage, which is an average value of a both end voltage of the converted analog signal comprises detecting the common mode voltage using at least one of a resistance distributor, switched capacitor, and transistor pair.

6. A digital-analog conversion device, comprising:
    a current supply unit that generates a reference current based on a reference voltage and that adjusts an amount of the reference current according to a feedback signal;
    a digital-analog conversion unit that converts a digital signal to an analog signal according to the generated reference current;
    a common mode feedback unit that detects a common mode voltage, which is an average value of a both end voltage of the converted analog signal; and
    a feedback signal generator that compares the detected common mode voltage and the reference voltage and that generates the feedback signal based on the comparison result.

7. The digital-analog converter of claim 6, wherein the feedback signal generator generates the feedback signal for reducing an amount of the reference current, if the detected common mode voltage is greater than the reference voltage and generates the feedback signal for increasing an amount of the reference current, if the detected common mode voltage is smaller than the reference voltage.

8. The digital-analog converter of claim 6, wherein the current supply unit increases or reduces the generated reference current with a digital method using an Aux Current Cell.

9. The digital-analog converter of claim 6, wherein the current supply unit adjusts a bias voltage used for generating the reference current with an analog method.

10. The digital-analog converter of claim 6, wherein the common mode feedback unit detects the common mode voltage using at least one of a resistance distributor, switched capacitor, and transistor pair.

* * * * *